(12) United States Patent
Wang et al.

(10) Patent No.: US 10,310,606 B2
(45) Date of Patent: Jun. 4, 2019

(54) PRESSURE FEEDBACK DEVICE FOR PROVIDING FEEDBACK OPERATION, TOUCH DISPLAY DEVICE AND METHOD FOR OPERATING THE SAME

(71) Applicant: BOE Technology Group Co., Ltd., Beijing (CN)

(72) Inventors: Long Wang, Beijing (CN); Li Zhou, Beijing (CN); Feng Jiang, Beijing (CN); Fangzhen Zhang, Beijing (CN); Chungchun Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 103 days.

(21) Appl. No.: 15/519,582

(22) PCT Filed: Oct. 26, 2016

(86) PCT No.: PCT/CN2016/103363
§ 371 (c)(1),
(2) Date: Apr. 17, 2017

(87) PCT Pub. No.: WO2017/076203
PCT Pub. Date: May 11, 2017

(65) Prior Publication Data
US 2018/0299958 A1    Oct. 18, 2018

(30) Foreign Application Priority Data
Nov. 5, 2015   (CN) .......................... 2015 1 0745092

(51) Int. Cl.
*G06F 3/01*         (2006.01)
*G06F 3/044*        (2006.01)
(Continued)

(52) U.S. Cl.
CPC ................ *G06F 3/016* (2013.01); *G06F 3/01* (2013.01); *G06F 3/044* (2013.01);
(Continued)

(58) Field of Classification Search
CPC ..... G06F 2203/014; G06F 2203/04809; G06F 3/016
See application file for complete search history.

(56) References Cited

U.S. PATENT DOCUMENTS

2007/0152982 A1* 7/2007 Kim .................... G06F 3/016
345/173
2012/0019448 A1* 1/2012 Pitkanen ............... G06F 1/1662
345/173
(Continued)

FOREIGN PATENT DOCUMENTS

CN      101292216 A      10/2008
CN      102004573         4/2011
(Continued)

OTHER PUBLICATIONS

First Office Action for U.S. Patent Application Serial No. 201510745092.0 dated Sep. 21, 2017.
(Continued)

*Primary Examiner* — Chun-Nan Lin
(74) *Attorney, Agent, or Firm* — Calfee, Halter & Griswold LLP

(57) ABSTRACT

A touch display device includes a display panel, a processor and a pressure sensing device and a touch feedback device disposed over the display panel. The pressure sensing device is configured to sense a pressure sensing upon an occurrence of touch, such that the pressure signal may be provided to the processor to generate a feedback signal. The touch feedback device is configured to perform a corresponding feedback operation according to the feedback signal.

14 Claims, 8 Drawing Sheets

(51) Int. Cl.
*H01L 41/08* (2006.01)
*H01L 41/113* (2006.01)

(52) U.S. Cl.
CPC ...... *H01L 41/0825* (2013.01); *H01L 41/1132* (2013.01); *G06F 2203/04105* (2013.01); *G06F 2203/04107* (2013.01); *G06F 2203/04111* (2013.01)

(56) References Cited

U.S. PATENT DOCUMENTS

| | | | |
|---|---|---|---|
| 2015/0077398 A1* | 3/2015 | Yairi | G06F 3/016 345/175 |
| 2015/0153887 A1* | 6/2015 | Kim | G06F 3/044 345/173 |

FOREIGN PATENT DOCUMENTS

| | | |
|---|---|---|
| CN | 102214029 A | 10/2011 |
| CN | 102265246 A | 11/2011 |
| CN | 102969445 | 3/2013 |
| CN | 103294183 A | 9/2013 |
| CN | 105373228 A | 3/2016 |
| EP | 2224313 A1 | 9/2010 |
| TW | 201108063 A | 11/2011 |

OTHER PUBLICATIONS

International Search Report and Written Opinion for International Application No. PCT/CN2016/103363 dated Feb. 4, 2017.
Office action from Chinese Application No. 201510745092.0 dated Mar. 22, 2019.

\* cited by examiner

PRESSURE FEEDBACK DEVICE FOR PROVIDING FEEDBACK OPERATION, TOUCH DISPLAY DEVICE AND METHOD FOR OPERATING THE SAME

CROSS REFERENCE

The present application is based upon International application Ser. No. PCT/CN2016/103363, filed on Oct. 26, 2016, which is based upon and claims priority to Chinese Patent Application No. 201510745092.0, filed on Nov. 5, 2015, and the entire contents thereof are incorporated herein by reference.

TECHNICAL FIELD

The present disclosure relates to the field of display technology, and in particular, to a pressure feedback device, a touch display device and a method for operating the same.

BACKGROUND

With the development of touch technology, a touch display device has been widely used in a smart terminal. Touch technology may comprise capacitive touch technology, resistive touch technology, optical touch technology, electromagnetic touch technology, and the like. Among the technologies, projection capacitive touch technology occupies an important position in the field of touch display technology, because it is easy to achieve multi-touch.

The touch display device usually has only a basic touch function. The operation experience may be the same regardless of the interface. Users may feel bored during long-term use of the touch display device due to its monotonous operation experience.

It should be noted that, information disclosed in the above background portion is provided only for better understanding of the background of the present disclosure, and thus it may contain information that does not form the prior art known by those ordinary skilled in the art.

SUMMARY

The present disclosure provides a pressure feedback device, a touch display device and a method for operating the same.

According to one aspect, the present disclosure provides a pressure feedback device, including a processor, a pressure sensing device, and a touch feedback device, wherein:

the pressure sensing device is configured to sense a pressure signal upon an occurrence of touch;

the processor is configured to generate a feedback signal according to the pressure signal; and the touch feedback device is configured to perform a corresponding feedback operation according to the feedback signal.

According to another aspect, the present disclosure provides a touch display device including a display panel and the above pressure feedback device disposed over the display panel.

According to another aspect of the present disclosure, the present disclosure provides a method for operating a touch display device including a display panel, a processor, and a pressure sensing device and a touch feedback device disposed on the display panel, wherein the method comprises:

sensing, by the pressure sensing device, a pressure signal upon an occurrence of touch;

generating, by the processor, a feedback signal according to the pressure signal; and performing, by the touch feedback device, a corresponding feedback operation according to the feedback signal.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

DETAILED DESCRIPTION

In order to provide a better understanding of the implementations of the present disclosure to those skilled in the art, a pressure feedback device, a touch display device and a method for operating the same will now be described hereinafter in detail with reference to the accompanying drawings.

At least some embodiments of the present disclosure provide a touch feedback device including a pressure sensing device and a touch feedback device. The pressure sensing device is configured to sense a pressure signal upon an occurrence of touch, such that the pressure signal may be provided to a processor to generate a feedback signal. The touch feedback device is configured to perform a corresponding feedback operation according to the feedback signal.

In this embodiment, the pressure sensing device comprises a common electrode layer, a first piezoelectric material layer and a signal transmitting layer. The first piezoelectric material layer is interposed between the common electrode layer and the signal transmitting layer. Optionally, the common electrode layer has a thickness of 0.5 µm to 10 µm, the signal transmitting layer has a thickness of 0.5 µm to 10 µm, and the first piezoelectric material layer has a thickness of 10 µm to 200 µm.

In this embodiment, the touch feedback device comprises a first driving electrode layer, a second piezoelectric material layer and a second driving electrode layer. The second piezoelectric material layer is interposed between the first driving electrode layer and the second driving electrode layer. Optionally, the first driving electrode layer has a thickness of 0.5 µm to 10 µm, the second piezoelectric material layer has a thickness of 10 µm to 200 µm, and the second driving electrode layer has a thickness of 0.5 µm to 10 µm.

In the implementations of the pressure feedback device according to the present disclosure, upon an occurrence of touch, the pressure sensing device senses a pressure signal, the processor generates a feedback signal according to the pressure signal, and the touch feedback device performs a corresponding feedback operation according to the feedback signal. The implementations according to the present disclosure may improve the user's operating experience on the basis of touch function, thereby avoiding bored feelings of the user.

Figure 1:
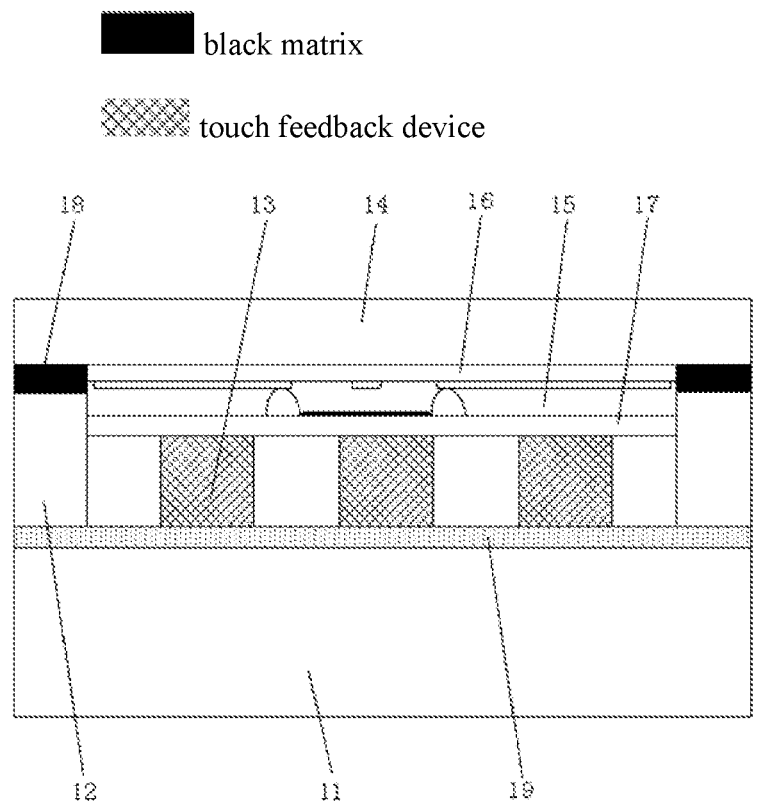
FIG. 1 is a schematic diagram of a touch display device according to at least some embodiments of the present disclosure.

FIG. 1 is a schematic structural diagram of a touch display device according to at least some embodiments of the present disclosure. As illustrated in FIG. 1, the touch display device comprises a display panel 11 and a pressure sensing device 12 and a touch feedback device 13 disposed over the display panel 11.

The pressure sensing device 12 is configured to sense a pressure signal upon an occurrence of touch, such that the touch signal may be provided to a processor to generate a feedback signal. The touch feedback device 13 is configured to perform a corresponding feedback operation according to the feedback signal.

Figure 2:
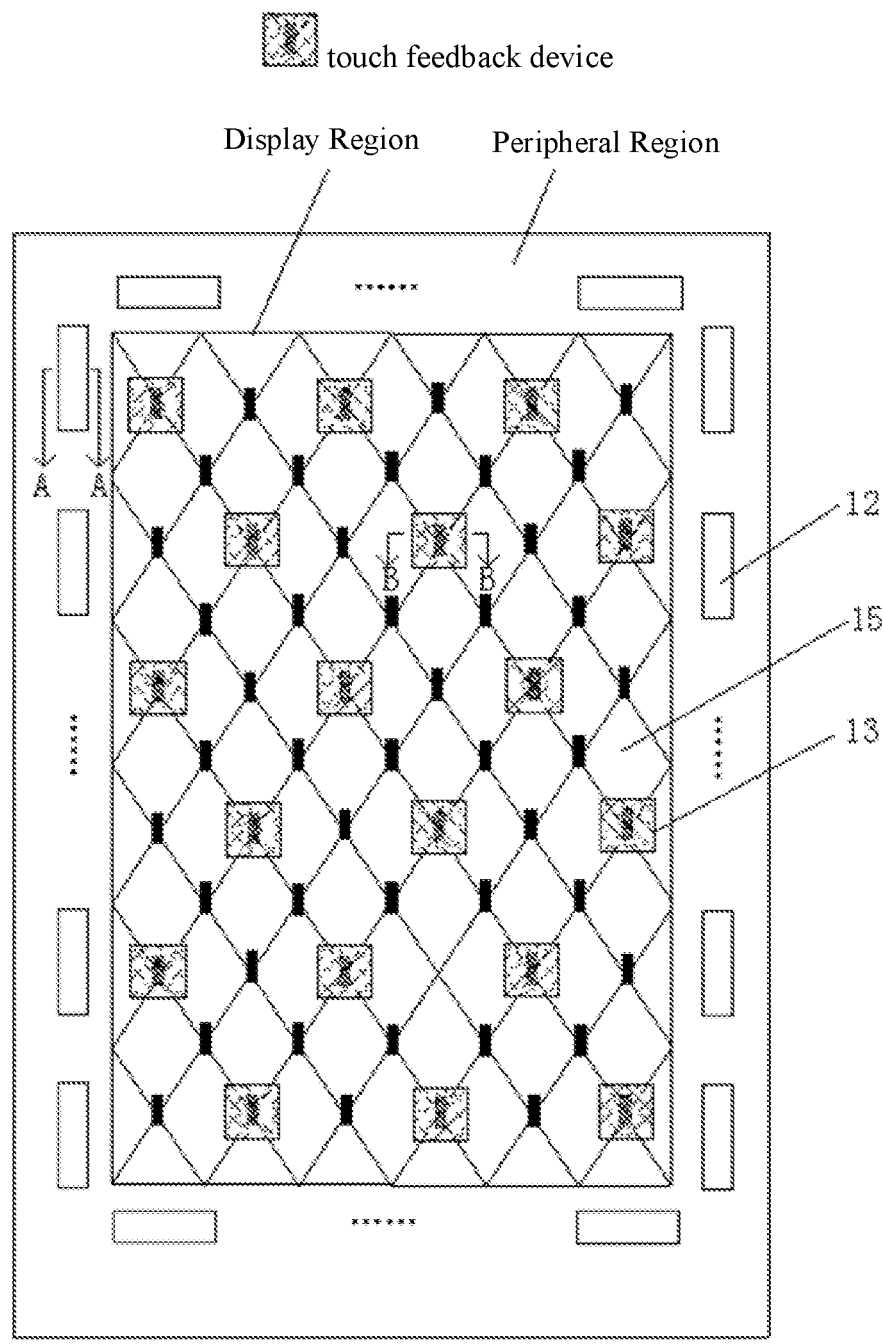
FIG. 2 is schematic plan view of a protective substrate illustrated in FIG. 1.

In the present embodiment, the pressure sensing device 12 and the touch feedback device 13 are disposed at a light exiting side of the display panel 11. Optionally, the touch display device further comprises a protective substrate 14 deposed at the light exiting side of the display panel 11, and the pressure sensing device 12 and the touch feedback device 13 are disposed on the protective substrate 14. FIG. 2 is a schematic plan view of the protective substrate illustrated in FIG. 1. As illustrated in FIG. 2, the pressure sensing device 12 and the touch feedback device 13 are disposed on the protective substrate 14. The touch display device is formed with a display region and a peripheral region located around the display region. The pressure sensing device 12 is disposed in the peripheral region. The touch feedback device 13 is disposed in the display region. In one embodiment, a plurality of pressure sensing devices 12 are uniformly disposed in the peripheral region, and a plurality of touch feedback devices 13 are uniformly disposed in the display region.

Further, the touch display device further comprises a black matrix 18 interposed between the pressure sensing device 12 and the protective substrate 14, wherein the black matrix 18 is disposed in the peripheral region. The black matrix 18 may be configured to block the pressure sensing device 12 and the design wirings in the peripheral region.

As illustrated in FIGS. 1 and 2, the display panel 11 may be a non-touch display panel which does not comprise the touch sensing device. In this case, the touch display device further comprises a touch sensing device 15. The touch sensing device 15 is disposed at the light exiting side of the display panel. The touch sensing device 15 is configured to sense touch position information upon an occurrence of touch. In particular, the touch sensing device 15 may be formed on the protective substrate 14, and a first insulation layer 16 is formed between the touch sensing device 15 and the protective substrate 14. The touch feedback device 13 is formed below the touch sensing device 15. A second insulation layer 17 is formed between the touch feedback device 13 and the touch sensing device 15.

Further, the touch display device further comprises a first adhesive layer 19. The first adhesive layer 19 is configured to bind the pressure sensing device 12 and the touch feedback device 13 to the display panel 11. In particular, the first adhesive layer 19 is disposed below the touch sensing device 12 and the touch feedback device 13.

In actual implementations, the touch sensing device may be disposed at the other side of the display panel opposite to the light exiting side, which is not particularly illustrated in the drawings.

Figure 3:
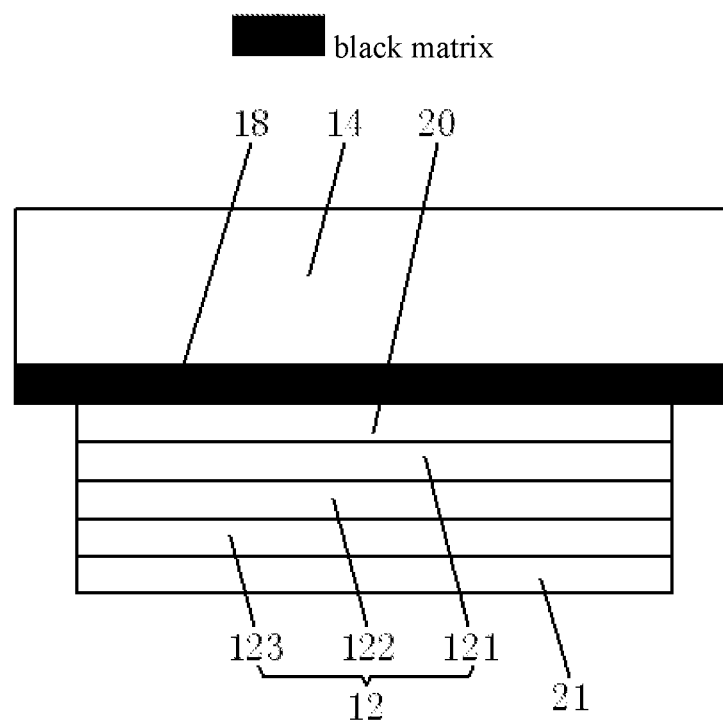
FIG. 3 is a cross sectional view taken along a line A-A of FIG. 2.

FIG. 3 is a cross section view taken along a line A-A in FIG. 2. As illustrated in FIG. 3, the pressure sensing device 12 is formed using direct piezoelectric properties of the piezoelectric material. In one embodiment, according to the direct piezoelectric properties of the piezoelectric material, the material may be electrically polarized under an application of physical external force. The pressure sensing device 12 may comprise a common electrode layer 121, a first piezoelectric material layer 122 and a signal transmitting layer 123, and the first piezoelectric material layer 122 is interposed between the common electrode layer 121 and the signal transmitting layer 123. The black matrix 18 is formed on the protective substrate 14, a third insulation layer 20 is formed on the black matrix 18, the common electrode layer 121 is formed on the third insulation layer 20, and a fourth insulation layer 21 is formed on the signal transmitting layer 123. In the present embodiment, the third insulation layer 20 and the fourth insulation layer 21 are not particularly illustrated in FIG. 1. In particular, as illustrated in FIG. 3, the black matrix 18 is disposed under the protective substrate 14, the third insulation layer 20 is disposed under the black matrix 18, the common electrode layer 121 is disposed under the third insulation layer 20, the first piezoelectric material layer 122 is disposed under the common electrode layer 121, the signal transmitting layer 123 is disposed under the first piezoelectric material layer 122, and the fourth insulation layer 21 is disposed under the signal transmitting layer 123. In the present embodiment, the protective substrate 14 may be formed of a material such as a reinforced glass, a polyimide (PI) or a polyethylene terephthalate (PET). Optionally, protective substrate 14 is formed of a reinforced glass. The third insulation layer 20 is configured to isolate the pressure sensing device 12 from other components to protect the pressure sensing device 12. The fourth insulation layer 21 is configured to isolate the pressure sensing device 12 from other components to protect the pressure sensing device 12. The common electrode layer 121 may be formed of a transparent conductive material such as indium tin oxide (ITO), silver nanowire, silver alloy, graphene, carbon nanotube, or a carbon nanobud. The common electrode layer 121 may have a thickness of 0.5 µm to 10 µm. The first piezoelectric material layer 122 may be formed of piezoelectric crystal, piezoelectric polymer, or a composite material of piezoelectric crystal and piezoelectric polymer. For example, the piezoelectric crystal may be a quartz crystal or a piezoelectric ceramic, and the piezoelectric polymer may comprise any one of polyvinylidene fluoride based, polyvinyl fluoride, polyvinyl chloride, isobutylene, methyl methacrylate, and vinyl benzoate, or a copolymer of any combination thereof. The first piezoelectric material layer 122 may have a thickness of 10 µm to 200 µm. The first piezoelectric material layer 122 may be configured to convert a physical external force into a pressure signal. The signal transmitting layer 123 may be formed of a transparent conductive material such as ITO, silver nanowire, silver alloy, grapheme, carbon nanotube, or carbon nanobud. The signal transmitting layer 123 may have a thickness of 0.5 µm to 10 µm.

Figure 4:
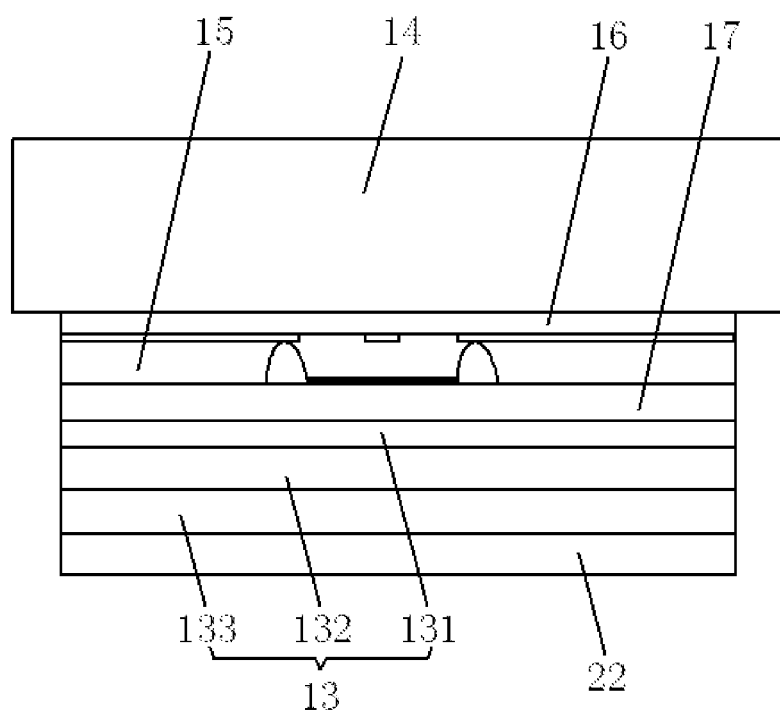
FIG. 4 is a cross sectional view taken along a line B-B of FIG. 2.

FIG. 4 is a cross sectional view taken along a line B-B in FIG. 2. As illustrated in FIG. 4, the touch feedback device 13 is formed using inverse piezoelectric properties of the piezoelectric material. In one embodiment, according to the inverse piezoelectric properties of the piezoelectric material, the material may be deformed by external electric field. The touch feedback device 13 may comprise a first driving electrode layer 131, a second piezoelectric material layer 132, and a second driving electrode layer 133. The second piezoelectric material layer 132 is interposed between the first driving electrode layer 131 and the second driving electrode layer 133. A first insulation layer 16 is formed on the protective substrate 14. The touch sensing device 15 is formed on the first insulation layer 16. A second insulation layer 17 is formed on the touch sensing device 15. The first driving electrode layer 131 is formed on the second insulation layer 17. A fifth insulation layer 22 is formed on the second driving electrode layer 133. The fifth insulation layer 22 is not particularly illustrated in FIG. 1. In particular, in FIG. 4, the first insulation layer 16 is disposed under the protective substrate 14. The touch sensing device 15 is disposed under the first insulation layer 16. The second insulation layer 17 is disposed under the touch sensing device 15. The first driving electrode 131 is disposed under the second insulation layer 17. The second piezoelectric material layer 132 is disposed under the first driving electrode layer 131. The second driving electrode 133 is disposed under the second piezoelectric material layer 132. The fifth insulation layer 22 is disposed under the second driving electrode layer 133. In the present embodiment, the protective substrate 14 may be formed of a material such as a reinforced glass, a polyimide (PI), or a polyethylene terephthalate (PET). Optionally, the protective substrate 14 is formed of a reinforced glass. The first insulation layer 16 may be formed of an insulating polymer material having good optical transparency. The first insulation layer 126 may be configured to isolate the touch sensing device 15 from other components to protect the touch sensing device 15. In the present embodiment, the touch sensing device 15 is a capacitive touch sensing device. Optionally, the touch sensing device 15 is a bridge type capacitive touch sensing device. In an actual implementation, the touch sensing device 15 may also be other types of touch sensing devices, as long as it is compatible with the processor. The second insulation layer 17 may be formed of an insulating polymer material having good optical transparency. The second insulation layer 17 may be configured to isolate the touch sensing device from the touch feedback device 13 to protect the touch sensing device 15. The first driving electrode layer 131 may be formed of a transparent conductive material such as ITO, silver nanowire, silver alloy, grapheme, carbon nanotube, or carbon nanobud. The first driving electrode 131 may have a thickness of 0.5 µm to 10 µm. The second piezoelectric material layer 132 may be formed of piezoelectric crystal, piezoelectric polymer, or a composite material of piezoelectric crystal and piezoelectric polymer. For example, the piezoelectric crystal may be a quartz crystal or a piezoelectric ceramic, and the piezoelectric polymer may comprise any one of polyvinylidene fluoride based, polyvinyl fluoride, polyvinyl chloride, isobutylene, methyl methacrylate, and vinyl benzoate, or a copolymer of any combination thereof. The second piezoelectric material layer 132 may have a thickness of 10 µm to 200 µm. The second piezoelectric material layer 132 may be configured to generate a physical deformation according to the feedback signal. The second driving electrode layer 133 may be formed of a transparent conductive material such as ITO, silver nanowire, silver alloy, grapheme, carbon nanotube, or carbon nanobud. The second driving electrode layer 133 may have a thickness of 0.5 µm to 10 µm. The fifth insulation layer 22 may be formed of an insulating polymer material having good optical transparency. The fifth insulation layer 22 may be configured to isolate the touch feedback device 13 from other components to protect the touch feedback device 13.

In the present embodiment, optionally, the common electrode layer 121 and the first driving electrode 131 may be disposed in the same layer. The first piezoelectric material layer 122 and the second piezoelectric material layer 132 may be disposed in the same layer. The signal transmitting layer 123 and the second driving electrode layer 133 may be formed in the same layer. The third insulation layer 20 and the second insulation layer 17 may be disposed in the same layer. The fourth insulation layer 21 and the fifth insulation layer 22 may be disposed in the same layer. In an actual implementation, each of the above components may be provided separately, and the configuration thereof may vary according to actual requirements, which will not be listed herein.

Figure 5:
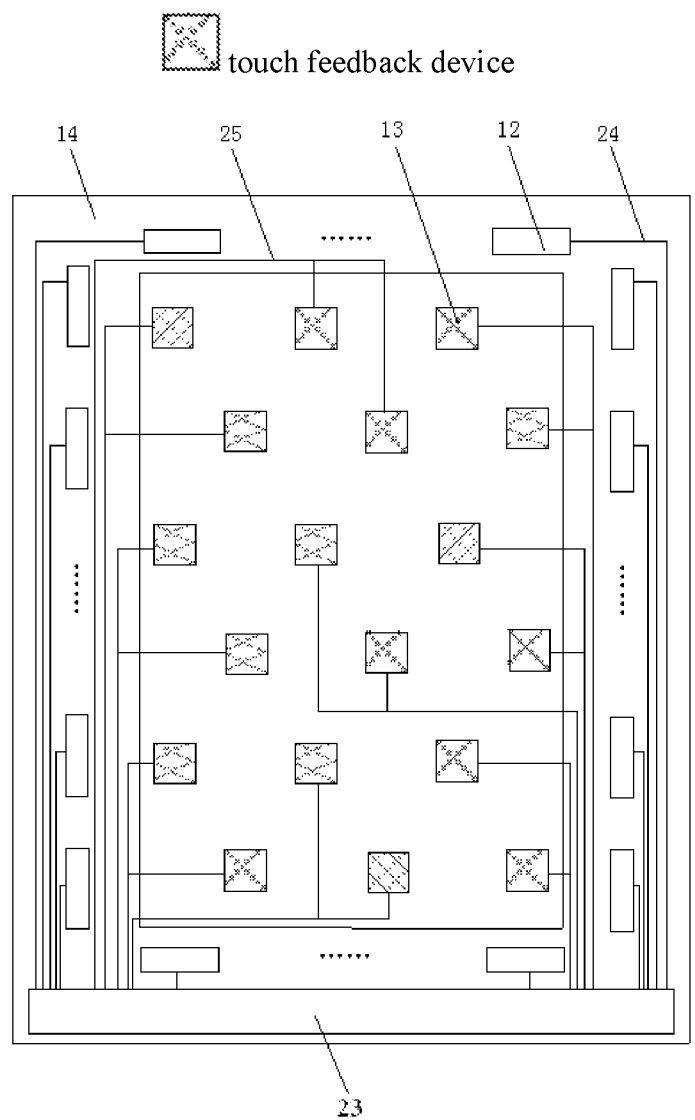
FIG. 5 is a schematic view illustrating a circuit connection of a touch display device according to at least some embodiments of the present disclosure.

FIG. 5 is a schematic view illustrating a circuit connection of a touch display device of FIG. 1. As illustrated in FIG. 5, the touch display device further comprises a flexible circuit board 23, a first signal transmitting line 24, and a second signal transmitting line 25. Each of the flexible circuit board 23, the first signal transmitting line 24, and the second signal transmitting line 25 may be disposed on the protective substrate 14. The pressure sensing device 12 is connected to the flexible circuit board 23 through the second signal transmitting line 24. The touch feedback device 13 is connected to the flexible circuit board 23 through the second signal transmitting line 25. Each pressure sensing device 12 is connected to the flexible circuit board 23 through one signal transmitting line 24. That is, a plurality of pressure sensing devices 12 are connected to the flexible circuit board 23, respectively. In this way, the single-line connection may improve sensitivity of the sensed pressure signal. A plurality of touch feedback devices 13 are connected to the flexible circuit board 23 through one second signal transmitting line 25. In FIG. 5, two touch feedback devices 13 are connected to the flexible circuit board 23 through one second signal transmitting line 25. That is, a plurality of touch feedback devices 13 are connected to the flexible circuit board 23 in parallel. The parallel-connection may increase a signal intensity of the generated feedback signal. In an actual implementation, the pressure sensing device 12 and the touch feedback device 13 may be connected to the flexible circuit board 23 by other means, which will not be listed therein. In the present embodiment, the flexible circuit board 23 is further connected to the processor, such that the pressure sensing device 12 and the touch feedback device 13 are connected to the processor through the flexible circuit board 23.

As illustrated in FIG. 3 and FIG. 5, the first signal transmitting line 24 may comprise a driving signal transmitting line and a pressure signal transmitting line. The driving signal transmitting line is connected to the flexible circuit board 23 and the common electrode layer 121. The pressure signal transmitting line is connected to the flexible circuit board 23 and the signal transmitting layer 123. In one embodiment, the first signal transmitting line 24 may be formed in two layers, one layer of which may be the driving signal transmitting line, and the other layer may be the pressure signal transmitting line. The second signal transmitting line 25 may comprise a first feedback signal transmitting line and a second feedback signal transmitting line. The first feedback signal transmitting line is connected to the flexible circuit board 23 and the first driving electrode layer 131. The second feedback signal transmitting line is connected to the flexible circuit board 23 and the second driving electrode layer 133. In one embodiment, the second signal transmitting line 25 may be formed in two layers, one layer of which may be the first feedback signal transmitting line, and the other layer may be the second feedback signal transmitting line.

Hereinafter, an operating principle of the touch display device will be described in detail with reference to FIGS. 1 to 5. While performing a conductor touch operation, the touch sensing device 15 is configured to sense touch position information upon an occurrence of touch. The pressure sensing device 12 is configured to sense a pressure signal upon the occurrence of touch, and to send the pressure signal to the processor through the flexible circuit board 23. In one embodiment, the pressure signal may comprise information such as the touch speed and/or touch strength or the like. The processor generates the feedback signal according to the pressure signal, and sends the feedback signal to the flexible circuit board 23. The flexible circuit board 23 sends the feedback signal to the touch feedback device 13. The touch feedback device 13 performs a corresponding feedback operation according to the feedback signal.

While performing a non-conductor touch, the touch sensing device 15 does not perform sensing, and the pressure sensing device 12 senses a pressure signal and sends the pressure signal to the processor through the flexible circuit board 23. In one embodiment, the pressure signal may comprise information such as the touch speed and/or touch strength or the like. The processor generates the feedback signal according to the pressure signal, and sends the feedback signal to the flexible circuit board 23. The flexible circuit board 23 sends the feedback signal to the touch feedback device 13. The touch feedback device 13 performs a corresponding feedback operation according to the feedback signal. Also, the processor may generate position information according to the pressure signal.

In one embodiment, the flexible circuit board 23 sends a driving signal to the common electrode layer 121 through the driving signal transmitting line. When the common electrode layer 121 receives the driving signal, the first piezoelectric material layer 122 senses a pressure signal under the drive of the driving signal, and sends the pressure signal to the flexible circuit board through the pressure signal transmitting line. The flexible circuit board 23 sends the pressure signal to the processor.

In one embodiment, the feedback signal comprises a first feedback sub signal and a second feedback sub signal. The flexible circuit board 23 sends the first feedback sub signal to the first driving electrode layer 131 through the first feedback signal transmitting line. The flexible circuit board 23 sends the second feedback sub signal to the second driving electrode layer 133 through the first feedback signal transmitting line. The first feedback sub signal loaded on the first driving electrode layer 131 and the second feedback sub signal loaded on the second driving electrode layer 133 may form a feedback field. The second piezoelectric material layer 132 generates a physical deformation according to the feedback field, i.e., performs a corresponding feedback operation.

Optionally, the touch feedback device 13 may vibrate according to the feedback signal. In particular, the touch feedback device may generate a vibration having a predetermined vibration frequency and/or vibration intensity according to the feedback signal. In one embodiment, the predetermined vibration frequency and/or vibration intensity may be adjusted by adjusting the feedback signal. In an actual implementation, the corresponding feedback operation is not limited to the vibration. For example, the corresponding feedback operation may comprise raising temperature or making a sound, which will not be listed herein.

Further, in order to improve feedback operation experience, the touch display device may further comprise an auxiliary device. The auxiliary device may comprise a vibration direction adjustor, a vibration amplifier or a temperature sensor. In one embodiment, the vibration direction adjuster is configured to adjust a vibration direction, and the vibration amplifier is configured to amplify the vibration.

In the present embodiment, the display panel 11 may be a liquid crystal display (LCD), an active-matrix organic light emitting diode (AMOLED) display panel, an electrophoresis display (EPD) display panel, a micro-electro-mechanical system (MEMS) display panel, an electrowetting display panel, or a quantum dots light emitting diode (QD-LED) display panel.

According to the touch feedback device of the present disclosure, it is possible to perform a multi-touch, a conductor touch, or a non-conductor touch, and meanwhile to provide a touch feedback to the user while performing the multi-touch, the conductor touch, or the non-conductor touch.

In the touch display device according to the present disclosure, upon an occurrence of touch, the pressure sensing device senses a pressure signal, the processor generates a feedback signal according to the pressure signal, and the touch feedback device performs a corresponding feedback operation according to the feedback signal. The implementations according to the present disclosure may improve the user's operating experience on the basis of touch function, thereby avoiding bored feelings of the user.

Figure 6:
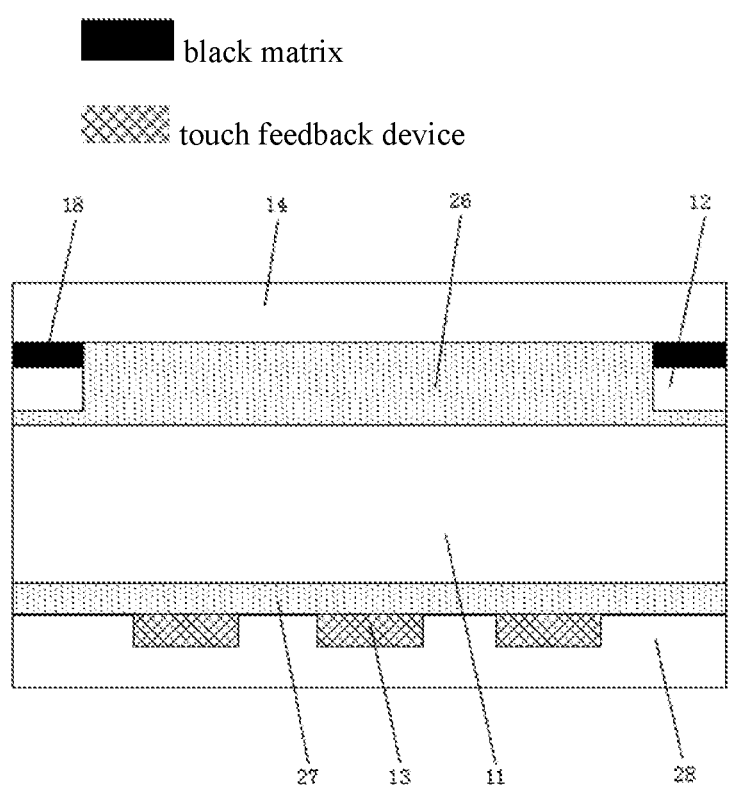
FIG. 6 is a schematic structural diagram of a touch display device according to at least some embodiments of the present disclosure.

FIG. 6 is a schematic structural diagram of a touch display device according to at least some embodiments of the present disclosure. As illustrated in FIG. 6, the present embodiment differs from that of FIG. 1 in that the pressure sensing device 12 and the touch feedback device 13 are disposed at different sides of the display panel 11. In particular, the pressure sensing device 12 is disposed at a light exiting side of the display panel, and the touch feedback device 13 is disposed at the other side of the display panel 11 opposite to the light exiting side.

In the present embodiment, the pressure sensing device 12 is disposed on the protective substrate 14. The touch feedback device 13 is disposed at the other side of the display panel 11 opposite to the light exiting side. In an actual implementation, alternatively, the touch feedback device is disposed on the protective substrate, and the pressure sensing device is disposed at the other side of the display panel 11 opposite to the light exiting side, which is not illustrated in particular.

In the present embodiment, the touch display device further comprises a second adhesive layer 26 and a third adhesive layer 27. The second adhesive layer 26 is configured to bind the pressure sensing device 12 to the display panel 11. In particular, the second adhesive layer 26 is disposed under the pressure sensing device 12 and the protective substrate 14. The third adhesive layer 27 is configured to bind the touch feedback device 13 to the display panel 11. In particular, the third adhesive layer 27 is disposed under the display panel 11.

In the present embodiment, the touch display device further comprises a sixth insulation layer 28. The sixth insulation layer 28 is disposed on the touch feedback device 13. The sixth insulation layer 28 is configured to isolate the touch feedback device 13 from other components to protect the touch feedback device 13.

In the present embodiment, the display panel 11 is a touch display panel, and the display panel 11 comprises the touch sensing device which is configured to sense touch position information upon an occurrence of touch. In the present disclosure, the touch sensing device is not illustrated in particular in FIG. 6, since the touch sensing device is a part of the structure of the display panel 11.

Other descriptions regarding the touch display device may refer to the above embodiments, which will not be repeated herein.

In the touch display device according to the present embodiment, upon an occurrence of touch, the pressure sensing device senses a pressure signal, the processor generates a feedback signal according to the pressure signal, and the touch feedback device performs a corresponding feedback operation according to the feedback signal. The implementations according to the present disclosure may improve the user's operating experience on the basis of touch function, thereby avoiding bored feelings of the user.

Figure 7:
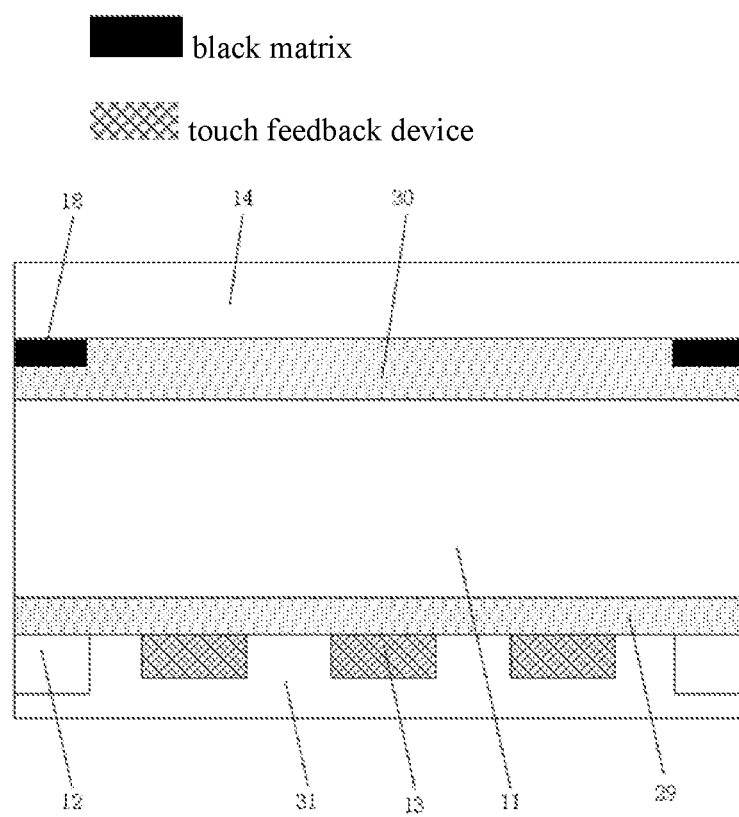
FIG. 7 is a schematic structural diagram of a touch display device according to at least some embodiments of the present disclosure.

FIG. 7 is a schematic structural diagram of a touch display device according to at least some embodiments of the present disclosure. As illustrated in FIG. 7, the present embodiment differs from that of FIG. 1 in that the pressure sensing device 12 and the touch feedback device 13 are disposed at the other side of the display panel 11 opposite to the light exiting side.

In the present embodiment, the touch display device further comprises a fourth adhesive layer 29. The fourth adhesive layer 29 is configured to bind the pressure sensing device 12 and the touch feedback device 13 to the display panel 11. In particular, the fourth adhesive layer 29 is disposed under the display panel 11.

In the present embodiment, the touch display device further comprises a fifth adhesive layer 30 configured to bind the protective substrate 14 to the display panel 11. In particular, the fifth adhesive layer 30 is disposed under the protective substrate 14.

In the present embodiment, the touch display device further comprises a seventh insulation layer 31. The seventh insulation layer 31 is disposed on the pressure sensing device 12 and the touch feedback device 13. The seventh insulation layer 31 is configured to isolate the pressure sensing device 12 and the touch feedback device 13 from other components to protect the pressure sensing device 12 and the touch feedback device 13.

In the present embodiment, the display panel 11 is a touch display panel, and the display panel 11 comprises the touch sensing device which is configured to sense touch position information upon an occurrence of touch. In the present disclosure, the touch sensing device is not illustrated in particular in FIG. 7, since the touch sensing device is a part of the structure of the display panel 11.

Other descriptions regarding the touch display device may refer to the above embodiments, which will not be repeated herein.

In the touch display device according to the present embodiment, upon an occurrence of touch, the pressure sensing device senses a pressure signal, the processor generates a feedback signal according to the pressure signal, and the touch feedback device performs a corresponding feedback operation according to the feedback signal. The implementations according to the present disclosure may improve the user's operating experience on the basis of touch function, thereby avoiding bored feelings of the user.

Figure 8:
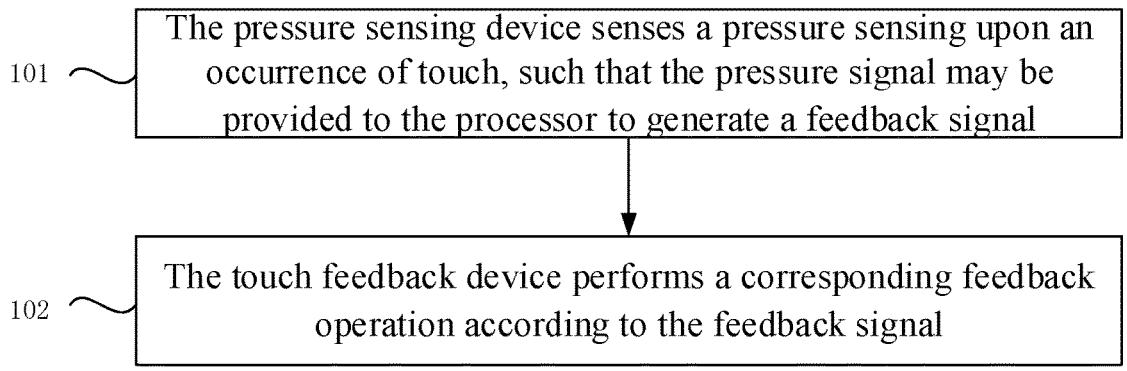
FIG. 8 is a flow chart of a method for operating a touch display device according to at least some embodiments of the present disclosure.

FIG. 8 is a flow chart of a method for operating a touch display device according to at least some embodiments of the present disclosure. As illustrated in FIG. 8, the method comprises the steps that follow.

In step 101, a pressure sensing device senses a pressure signal upon an occurrence of touch, such that the pressure signal may be provided to a processor to generate a feedback signal.

In step 102, a touch feedback device performs a corresponding feedback operation according to the feedback signal.

In this step, the touch feedback device generates a vibration according to the feedback signal.

In the method for operating the touch display device according to embodiments of the present disclosure, upon an occurrence of touch, the pressure sensing device senses a pressure signal, the processor generates a feedback signal according to the pressure signal, and the touch feedback device performs a corresponding feedback operation according to the feedback signal. The implementations according to the present disclosure may improve the user's operating experience on the basis of touch function, thereby avoiding bored feelings of the user.

It should be appreciated that, the above embodiments are exemplary implementations for illustrating the principle of the present disclosure only, while the present disclosure is not limited thereto. Various modifications and improvements are possible to those ordinary skilled in the art without departing from the spirit and essence of the present disclosure. All these modifications and improvements will also fall into the protection scope of the present disclosure.

What is claimed is:

1. A pressure feedback device comprising:
   a pressure sensing device, configured to sense a pressure signal upon an occurrence of touch;
   a processor, configured to generate a feedback signal according to the pressure signal; and
   a touch feedback device, configured to perform a corresponding feedback operation according to the feedback signal,
   wherein the pressure sensing device comprises a common electrode layer, a first piezoelectric material layer, and a signal transmitting layer, and the first piezoelectric material layer is interposed between the common electrode layer and the signal transmitting layer, and
   wherein the common electrode layer has a thickness of 0.5 μm to 10 μm, the signal transmitting layer has a thickness of 0.5 μm to 10 μm, and the first piezoelectric material layer has a thickness of 10 μm to 200 μm.

2. A pressure feedback device comprising:
   a pressure sensing device, configured to sense a pressure signal upon an occurrence of touch;
   a processor, configured to generate a feedback signal according to the pressure signal; and
   a touch feedback device, configured to perform a corresponding feedback operation according to the feedback signal,
   wherein the touch feedback device comprises a first driving electrode layer, a second piezoelectric material layer and a second driving electrode layer, and the second piezoelectric material layer is interposed between the first driving electrode layer and the second driving electrode layer, and wherein the pressure sensing device comprises a common electrode layer, a first piezoelectric material layer, and a signal transmitting layer, and the first piezoelectric material layer is interposed between the common electrode layer and the signal transmitting layer; the common electrode layer is disposed in the same layer as the first driving electrode; the first piezoelectric material layer is disposed in the same layer as the second piezoelectric material layer; and the signal transmitting layer is disposed in the same layer as the second driving electrode layer.

3. The pressure feedback device according to claim 2, wherein the first driving electrode layer has a thickness of 0.5 μm to 10 μm, the second piezoelectric material layer has a thickness of 10 μm to 200 μm, and the second driving electrode layer has a thickness of 0.5 μm to 10 μm.

4. A touch display device comprising a display panel and a pressure feedback device disposed over the display panel, wherein the pressure feedback device comprises:
   a pressure sensing device, configured to sense a pressure signal upon an occurrence of touch;
   a processor, configured to generate a feedback signal according to the pressure signal;
   a touch feedback device, configured to perform a corresponding feedback operation according to the feedback signal;
   a display region and a peripheral region located around the display region; wherein the pressure sensing device is disposed in the peripheral region, and the touch feedback device is disposed in the display region; and
   a flexible circuit board, a first signal transmitting line and a second signal transmitting line, wherein the pressure sensing device is connected to the flexible circuit board through the first signal transmitting line; and the touch feedback device is connected to the flexible circuit board through the second signal transmitting line.

5. The touch display device according to claim 4, wherein the pressure sensing device and the touch feedback device are disposed at a light exiting side front side of the display panel.

6. The touch display device according to claim 5 further comprising a protective substrate disposed at the front side of the display panel, and the pressure sensing device and the touch feedback device are disposed on the protective substrate.

7. The touch display device according to claim 4, wherein the pressure sensing device and the touch feedback device are disposed at a side of the display panel opposite to a front side of the display panel.

8. The touch display device according to claim 4, wherein the pressure sensing device and the touch feedback device are disposed at different sides of the display panel.

9. The touch display device according to claim 8 further comprising a protective substrate disposed at the front side of the display panel, wherein the pressure sensing device is disposed on the protective substrate, and the touch feedback device is disposed at the side of the display panel opposite to the front side;
   or alternatively, the touch feedback device is disposed on the protective substrate, and the pressure sensing device is disposed at the side of the display panel opposite to the front side.

10. The touch display device according to claim 4 further comprising a touch sensing device disposed at a front side of the display panel or a side of the display panel opposite to the front side, wherein the touch sensing device is configured to sense touch position information upon an occurrence of touch.

11. The touch display device according to claim 4, wherein the display panel is a touch display panel, and the display panel comprises a touch sensing device configured to sense touch position information upon an occurrence of touch.

12. The touch display device according to claim 4, wherein the processor is further configured to generate position information according to the pressure signal in the case of a non-conductor touch.

13. The touch display device according to claim 4, wherein each pressure sensing device is connected to the flexible circuit board through one of the first signal transmitting line; and at least two of the touch feedback devices are connected to the flexible circuit board through one of the second signal transmitting line.

14. The touch display device according to claim 4, wherein
   each first signal transmitting line comprises a driving signal transmitting line and a pressure signal transmitting line; the driving signal transmitting line is connected to the flexible circuit board and the common electrode layer of a corresponding pressure sensing device, and the pressure signal transmitting line is connected to the flexible circuit board and the signal transmitting layer of a corresponding pressure sensing device; and
   each second signal transmitting line comprises a first feedback signal transmitting line and a second feedback signal transmitting line; the first feedback signal transmitting line is connected to the flexible circuit board and the first driving electrode layer of a corresponding pressure sensing device; and the second feedback signal transmitting line is connected to the flexible circuit board and the second driving electrode layer of a corresponding pressure sensing device.

* * * * *